United States Patent
Wang et al.

(10) Patent No.: US 11,842,769 B2
(45) Date of Patent: Dec. 12, 2023

(54) MEMORY CIRCUIT WITH LEAKAGE CURRENT BLOCKING MECHANISM AND MEMORY DEVICE HAVING THE MEMORY CIRCUIT

(71) Applicant: MACRONIX International Co., Ltd., Hsinchu (TW)

(72) Inventors: Tien-Yen Wang, Hsinchu (TW); Yun-Chen Chou, Hsinchu (TW); Chun-Hsiung Hung, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 124 days.

(21) Appl. No.: 17/721,207

(22) Filed: Apr. 14, 2022

(65) Prior Publication Data
US 2023/0335187 A1 Oct. 19, 2023

(51) Int. Cl.
*G11C 11/419* (2006.01)

(52) U.S. Cl.
CPC .................. *G11C 11/419* (2013.01)

(58) Field of Classification Search
CPC .................................................. G11C 11/419
See application file for complete search history.

(56) References Cited

U.S. PATENT DOCUMENTS

| | | | | |
|---|---|---|---|---|
| 5,828,614 A | * | 10/1998 | Gradinariu | G11C 11/419 365/207 |
| 5,943,278 A | * | 8/1999 | Su | G11C 11/419 365/189.11 |
| 2008/0112234 A1 | * | 5/2008 | Tokito | G11C 11/413 365/189.16 |
| 2014/0153320 A1 | * | 6/2014 | Yamagami | G11C 11/413 365/154 |
| 2017/0287551 A1 | * | 10/2017 | Sahu | G11C 8/08 |
| 2022/0300255 A1 | * | 9/2022 | Shu | G11C 11/4085 |
| 2022/0358989 A1 | * | 11/2022 | Wijetunga | G11C 11/4074 |

* cited by examiner

*Primary Examiner* — Khamdan N. Alrobaie
(74) *Attorney, Agent, or Firm* — J.C. PATENTS (57) ABSTRACT

At least one embodiment of the disclosure is directed to a memory circuit having a leakage current blocking mechanism and a memory device having the memory circuit. In an aspect, one embodiment of the disclosure describes a memory circuit which includes not limited to a memory array which includes a first memory cell connected to a first bit line and a second memory cell connected to a second bit line, a pre-charge circuit which is connected to the memory array and includes a first pre-charge device, and a programming circuit which is connected to the pre-charge circuit and comprises a programming transistor which has a higher drive capability than the first pre-charge device so as to drive the first bit line to a ground voltage in response to the first write operation, wherein in response to a first write operation on the first memory cell, a current flow exists between the programming circuit and the first pre-charge device.

20 Claims, 6 Drawing Sheets

MEMORY CIRCUIT WITH LEAKAGE CURRENT BLOCKING MECHANISM AND MEMORY DEVICE HAVING THE MEMORY CIRCUIT

TECHNICAL FIELD

The disclosure is directed to a memory circuit having a leakage current blocking mechanism and a memory device having the memory circuit.

BACKGROUND

A memory cell typically operates under different states, and each of these states may require a different bias control at different timing in order to minimize the amount of leakage current which could be generated during a read or write operation. The leakage current would lead to power inefficiency and various performance issues. Moreover, too much leakage current may even lead to a failed write or read operation.

SUMMARY

In order to resolve the above-described challenges, at least one embodiment of the disclosure is directed to a memory circuit having a leakage current blocking mechanism and a memory device having the memory circuit.

In an aspect, one embodiment of the disclosure is directed to a memory circuit which includes not limited to: a memory array which includes a first memory cell connected to a first bit line and a second memory cell connected to a second bit line, a pre-charge circuit which is connected to the memory array and comprises a first pre-charge device, and a programming circuit which is connected to the pre-charge circuit and comprises a programming transistor which has a higher drive capability than the first pre-charge device so as to drive the first bit line to a ground voltage in response to the first write operation, wherein in response to a first write operation on the first memory cell, a current flow exists between the programming circuit and the first pre-charge device.

In an aspect, some embodiments of the disclosure is directed to a memory device which includes not limited to: a memory circuit which includes a memory array which includes a first memory cell connected to a first bit line and a second memory cell connected to a second bit line, a pre-charge circuit which is connected to the memory array and comprises a first pre-charge device, and a programming circuit which is connected to the pre-charge circuit and comprises a programming transistor which has a higher drive capability than the first pre-charge device so as to drive the first bit line to a ground voltage in response to the first write operation, wherein in response to a first write operation on the first memory cell, a current flow exists between the programming circuit and the first pre-charge device.

In order to make the aforementioned features and advantages of the disclosure comprehensible, exemplary embodiments accompanied with figures are described in detail below. It is to be understood that both the foregoing general description and the following detailed description are exemplary, and are intended to provide further explanation of the disclosure as claimed.

It should be understood, however, that this summary may not contain all of the aspect and embodiments of the disclosure and is therefore not meant to be limiting or restrictive in any manner. Also the disclosure would include improvements and modifications which are obvious to one skilled in the art.

BRIEF DESCRIPTION OF THE DRAWINGS

The accompanying drawings are included to provide a further understanding of at least one embodiment of the disclosure, and are incorporated in and constitute a part of this specification. The drawings illustrate embodiments of the disclosure and, together with the description, serve to explain the principles of the disclosure.

DETAILED DESCRIPTION OF DISCLOSED EMBODIMENTS

Reference will now be made in detail to the present exemplary embodiments of the disclosure, examples of which are illustrated in the accompanying drawings. Wherever possible, the same reference numbers are used in the drawings and the description to refer to the same or like parts.

Figure 1:
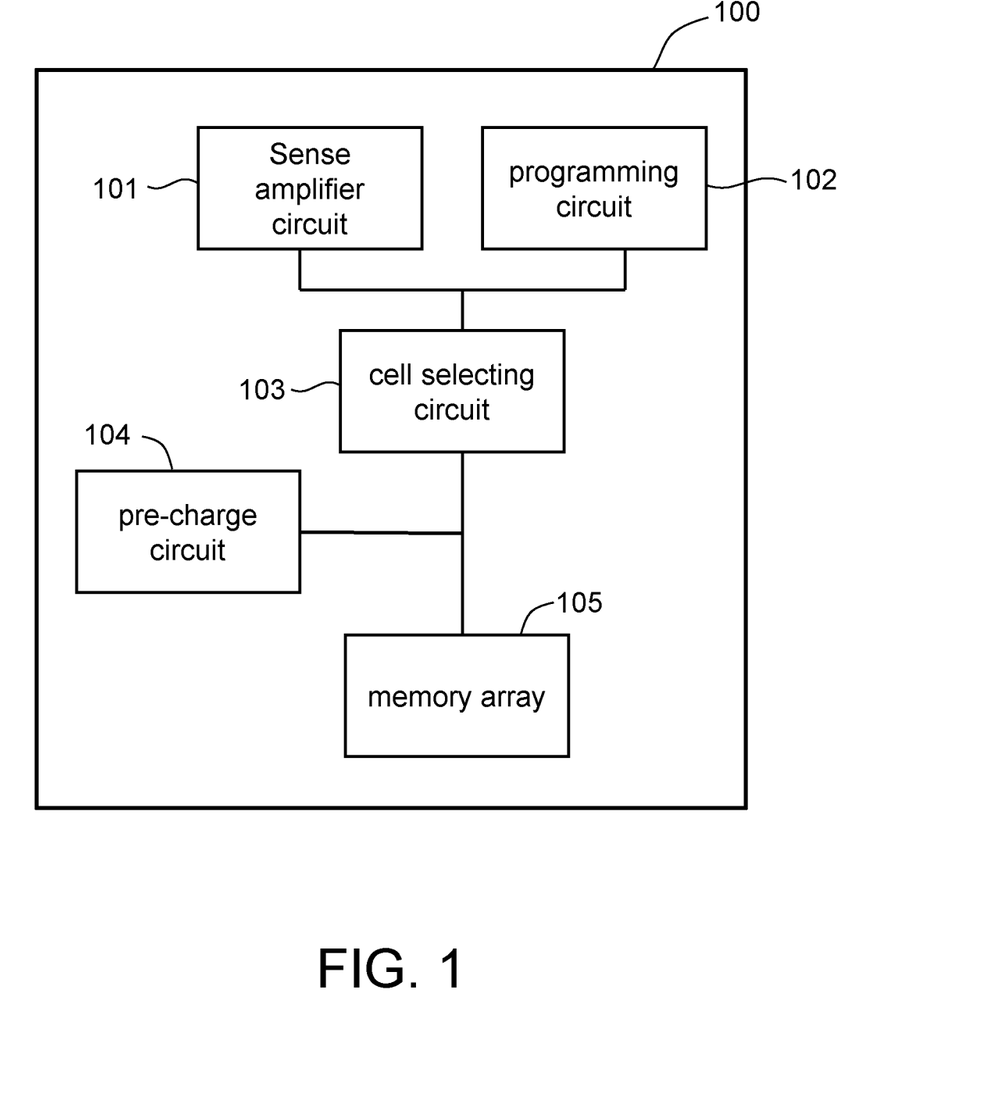
FIG. 1 illustrates a memory circuit according to an exemplary embodiment of the disclosure.

In order to provide proper biases and to reduce leakage current during a read or a write operation, at least one embodiment of the disclosure provides a memory circuit 100 which includes not limited to a sense amplifier circuit 101, a programming circuit 102, a cell selecting circuit 103, a pre-charge circuit 104, and a memory array 105 as shown in the circuit block diagram of FIG. 1. The memory array 105 includes a plurality of memory cells, each for storing a binary value. The memory array 105 could be accessed through a plurality word lines and a plurality of bit lines. Typically, a word line is connected to multiple memory cells in a row whereas a bit line is connected to multiple memory cells in a column; when a word line is activated, a binary value of a memory cell could be accessed through a bit line. Thus, the memory circuit 100 may include multiple bit lines such that a first memory cell of the plurality of memory cells could be connected to a first bit line, and a second memory cell of the plurality of memory cells could be connected to a second bit line.

The pre-charge circuit 104 may include multiple pre-charge devices, each for pre-charging a different bit line to a bias voltage such as a power supply voltage which could be set as, for example, 5 volts (V), but the disclosure does not limit the power supply voltage to any particular voltage. Each of the pre-charge devices could be a transistor, and each of the transistors could be of a different size. The memory circuit 100 may also include a programming circuit 102 which is for providing a bias current for the selected bit line. The programming circuit 104 could be connected to the pre-charge circuit 104 such that in response to a first write operation on the first memory cell, a current flow may exist between the programming circuit 102 and the first pre-charge device in the pre-charging circuit 104 corresponding to the first bit line.

The programming circuit 102 may include a programming transistor which has a higher drive capability than the first pre-charge device so as to drive the first bit line to a ground voltage in response to the first write operation. Assuming that the first pre-charge device is a first pre-charge transistor, a first gate width over length (W/L) ratio of the programming transistor could be designed to be larger than a second gate W/L ratio of the first pre-charge transistor. During a write operation (e.g first write operation), while the first bit line is at the ground voltage, the second bit line would maintain a high voltage (e.g. Vdd) (i.e. a binary high voltage or an activation voltage) which could be, for example, 5V so as to block a current flow from the second memory cell to the second bit line.

Assuming that the first memory cell includes a first transistor, in response to the first write operation, a current path could be generated between a word line of the first transistor and a drain (e.g. Node A) of the first transistor. After the selected first memory cell has been programmed, there could be a current path created between the word line and drain of the first transistor. Subsequently, during a read operation while a voltage provided on the WL of the first transistor, a current may flow on the path which has been generated from the word line to the drain of the first transistor. The current path could be generated by breaking down an oxide layer between the gate and the drain of the first transistor to create the current path. Also, the breaking down of the oxide layer is a permanent and an irreversible process.

As the pre-charge circuit 104 may include multiple pre-charge transistors, each of the transistors could be selectable according to a different selection signal corresponding to each of the plurality of transistors, and each of the pre-charge transistors may have the same or a different drive capability from the other pre-charge transistors.

Between different write operations on the same bit line, the pre-charge transistors may remain on between write operations. In other words, the pre-charge transistor may not have to be turned off between different write operations. Also, assuming that the second memory cell which corresponds to the second bit line is selected for a write operation, the second pre-charge transistor which corresponds to the second bit line could be at the ground voltage while the first pre-charge transistor which corresponds to the first bit line may drive the first bit line to the above described high voltage so as to block a leakage current between the first memory cell and the first bit line.

The memory circuit 100 may further include a sense amplifier circuit 101 for sensing the binary value on a global bit line since the sense amplifier circuit 101 is shared among a plurality of memory cells and shared between a plurality of bit lines. The coupling relationship between the global bit line and the plurality of bit lines could be determined by the bit line selecting circuit 103. The subsequent examples of this disclosure will provide further details and principle of operations with regard to these circuit blocks 101~105.

The memory circuit 100 could be implemented on any volatile memory device such as any type of random-access memory (RAM) including static random-access memory (SRAM), dynamic random-access memory (DRAM), and etc. or any type of non-volatile memory device such as a read only memory (ROM), a non-volatile random-access memory (NVRAM), and etc. A memory device may further include a memory controller (not shown) configured to execute a read or a write operation by controlling the operations of the circuit blocks 101~105.

Figure 2:
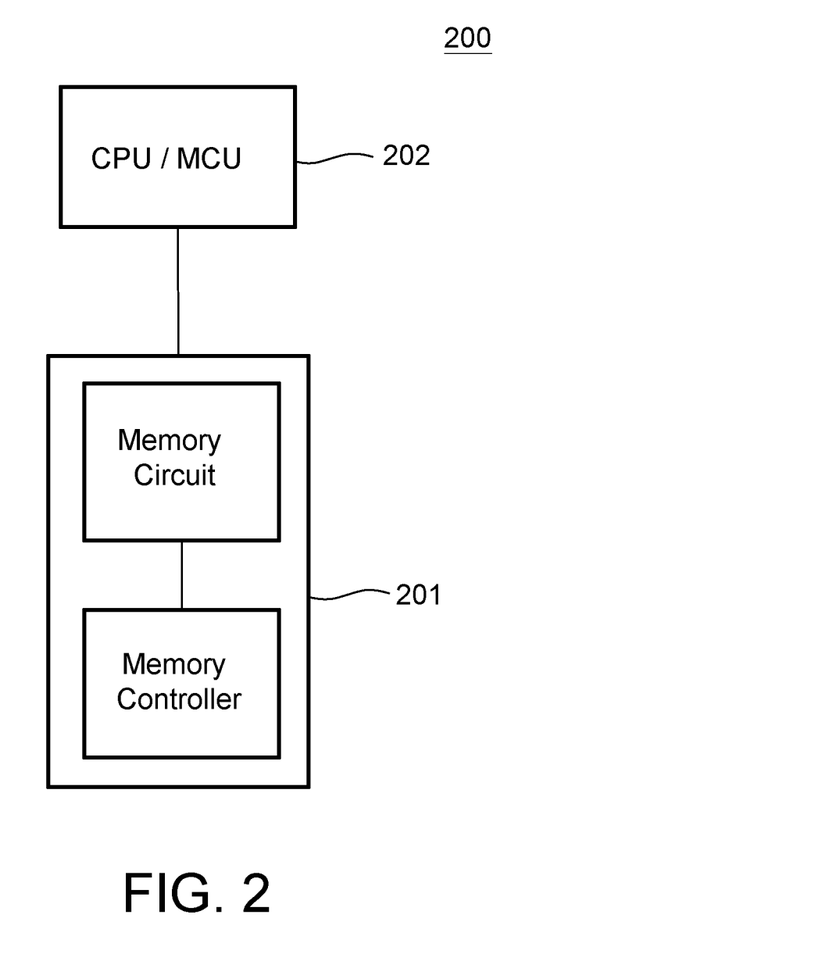
FIG. 2 illustrates an electronic device containing the memory circuit according to an exemplary embodiment of the disclosure.

FIG. 2 shows an electronic device 200 which includes not limited to a memory device 201 and processor 202 which could be a central processing unit (CPU), a microcontroller unit (MCU), and etc. The memory device may include not limited to the aforementioned memory circuit (e.g. 100) and typically a memory controller configures to perform at least read operations from the memory circuit (e.g. 100) or write operations on the memory circuit (e.g. 100). The electronic device 200 could be any electronic device which could be a PC, a mobile phone, a microcontroller based device, and etc. The memory device could be the RAM or the ROM which stores a program or a configuration for the electronic device. For example, the ROM could be configured with a fuse which upon activation may cause the ROM to store a configuration for the electronic device. The fuse could be implemented by the aforementioned oxide layer. When the oxide layer is broken down, it would cause a current flow between the word line and the drain of a memory cell transistor.

Figure 3:
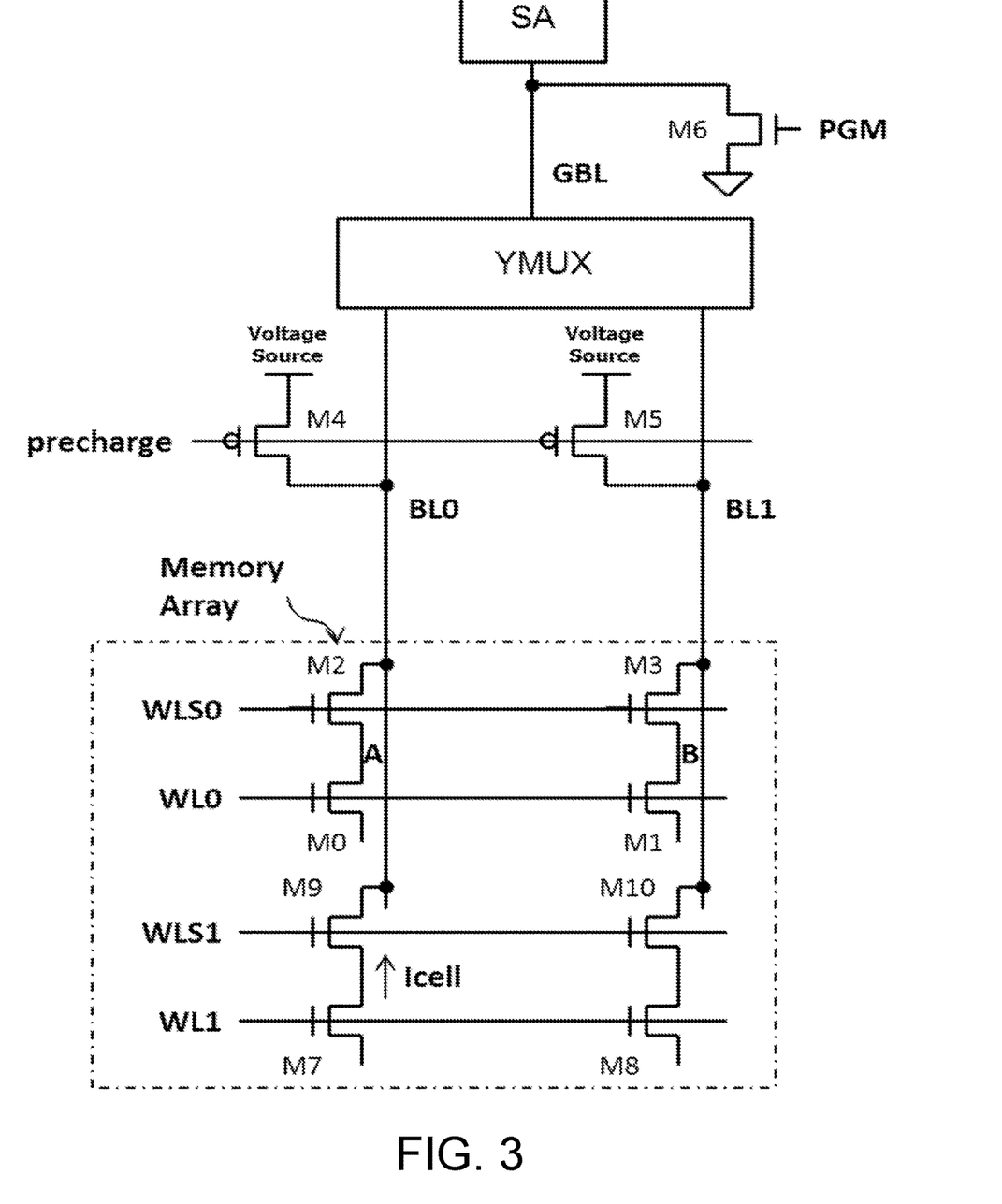
FIG. 3 illustrates a detailed hardware diagram of the memory circuit according to an exemplary embodiment of the disclosure.

To further expand on the structure of the memory circuit 100, FIG. 3 shows a detailed hardware diagram of the memory circuit 100. The memory circuit of FIG. 3 includes a memory array (e.g. 105) which has a plurality of memory cells. For explanatory purposes, the memory array of FIG. 3 includes a first word line section line (WSL0) which controls the transistor switch M2 coupled to the first bit line BL0 and the transistor switch M3 coupled to the second bit line BL1. The memory array also includes a second word line section line (WLS1) which controls the transistor switch M9 coupled to first bit line BL0 and the transistor switch M10 coupled to the second bit line BL1. The WL0 is configured to activate a first memory cell M0 and a second memory cell M1. The WL1 is configured to activate a third memory cell M7 and a fourth memory cell M8.

The first bit line BL0 is pre-charged by the first pre-charge device which could be a first pre-charge transistor M4. The second bit line BL1 is pre-charged by the second pre-charge device which could be a second pre-charge transistor M5. In this example, the first pre-charge device and the second pre-charge device is controlled (e.g. activated or deactivated) by a pre-charge signal. A memory controller (not shown) may control the bit line selecting circuit (e.g. 103) which in this example is a Y-multiplexer (YMUX) to select one of the first bit line BL0 or the second bit line BL1 to couple to the global bit line (GBL). The binary value of the GBL is sensed by the sense amplifier circuit SA (e.g. 101). For example, if the YMUX is controlled by the memory control to select the first bit line BL0, the sense amplifier SA may sense the binary value of the first bit line BL0.

During a write operation, the pre-charge transistors M4, M5 would be able to provide bias to the first bit line BL0 and the second bit line BL1 respectively by driving the voltage values of the first bit line BL0 and the second bit line BL1 to a high voltage such as the power supply voltage. However, when a cell has been selected through YMUX such as the first memory cell M0 for example, the programming circuit (e.g. 102) which could be a programing transistor M6 would pull the corresponding bit line (e.g. first bit line BL0) to a ground voltage. The programming transistor M6 may function as a current source which provides a bias current to a bit line. In order to pull the corresponding bit line to ground, the drive capability of the programming device would likely need to be higher than pre-charge device to ensure that the corresponding bit line could be pulled to the ground voltage by the programming device.

In this example, the drive capacity of the programming transistor M6 would need to be higher than the drive capacity of the first pre-charge transistor M4 so that the first bit line BL0 could be pulled to the ground voltage. The drive capacity of the programming transistor M6 could be made higher than the driving capacity of the first pre-charge transistor M4 if, for example, the transconductance (Gm) of the programming transistor M6 is higher than the transconductance of the first pre-charge transistor M4. The transconductance of the programming transistor M6 could be made higher than the transconductance of the first pre-charge transistor M4 if, for example, the first gate width over length (W/L) ratio of the programming transistor M6 is higher than the second W/L ratio of the first pre-charge transistor M4.

The drive capacity of the programming transistor M6 could be made higher than the driving capacity of the first pre-charge transistor M4 if, for example, the first pre-charge transistor M4 has a weaker bias than the programming transistor M6. The first pre-charge transistor M4 could be configured to have a weaker bias than the programming transistor M6 if, for example, the BL0 voltage is not pulled all the way to the ground voltage but is instead pulled 0.2~0.5 V above the ground voltage. The drive capacity of the programming transistor M6 could be made higher than the driving capacity of the first pre-charge transistor M4 if, for example, the transistor type of the programming transistor M6 is different from the transistor type of the first pre-charge transistor M4. For example, the programming transistor M6 could be a P-type transistor while the first pre-charge transistor M4 is a N type transistor.

Moreover, the first pre-charge device M4 would still be active even the programming transistor M6 has been turned on to pull the first bit line BL0 to the ground voltage. Also, while the first bit line BL0 has been pulled to the ground voltage, the second pre-charge device M5 would still need to hold the second bit line BL1 to the power supply voltage so as to block the leakage current leaking from the second memory cell M1 to the second bit line BL1. Similarly, if the second bit line BL1 has been selected by YMUX to be pulled to the ground voltage, the first pre-charge device M4 would need to hold the first bit line BL0 to the power supply voltage so as to block the leakage current leaking from the first memory cell M0 to the first bit line BL0.

In general, each of pre-charge devices of the pre-charge circuit (e.g. 104) could be a transistor, and each of the transistors could be connected to a different bit line. During a program or a write operation, there would be a current flow on the selected bit line between a corresponding pre-charge device of the pre-charge circuit (e.g. 104) and the programming circuit 102. For example, if the first bit line BL0 and the first word line WL0 have been selected, there would be a current flow between the programming transistor M6 and the first pre-charge device M4. In order to ensure that the drive capability of the programming transistor M6 is larger than the first pre-charge transistor M4, drive capability can be changed by changing the sizes, types or biases on the transistors M4 and M6. For the other cell (e.g. M1) which is not to be programed but is on the same selected WL (for example WL0) and is on a de-selected bit line (e.g. BL1), the corresponding pre-charge device (e.g. M5) has to ensure that the bit line voltage level is sufficiently high so as to block the current flow going from the memory cell M1 to its corresponding bit line which is the second bit line BL1.

Figure 4:
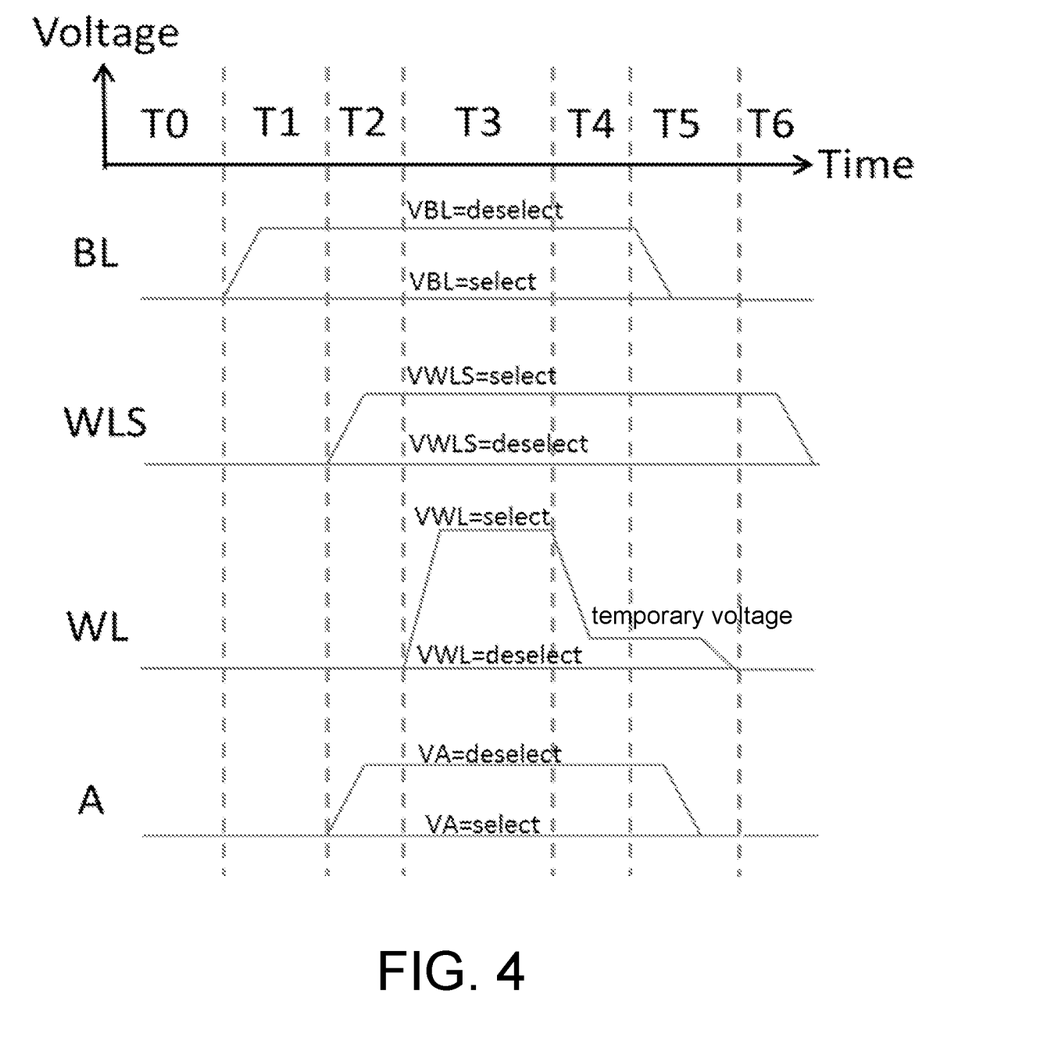
FIG. 4 is a timing diagram which serves to elucidate the principle of operation of a first exemplary embodiment of the disclosure.

The operating principle of the memory circuit of FIG. 3 is further explained in the timing diagram of FIG. 4. The description of FIG. 4 is to be made with reference to circuit diagram of FIG. 3. During the time T0 which is before the programming transistor M6 is activated, the first bit line BL0 and the second bit line BL1 are both at the ground voltage. After the programming transistor M6 has been activated within a first time period T1 in order to write to the first memory cell M0, the first bit line BL0 is pulled to the ground voltage by the programming transistor M6 even though the first pre-charge transistor M3 is still turned on while the second pre-charge transistor M5 drives the second bit line BL1 to a high voltage which could be, for example, 5V. Moreover, also during the first time period, the first word line section line WSL0, the first word line WL0, and the drain node A of the memory cell transistor are all set to the ground voltage.

Subsequently, during a second time period T2, the first word line section line WSL0 to pulled a voltage equivalent to the voltage source. while and the drain node A of the first memory cell M0 is at the ground voltage while the drain node B of the second memory cell M1 is at a voltage which could be 5V if M1 cell is been programmed previously or at a voltage which could be in between the voltage source and ground. Next, during a third time period T3, the first word line WL0 is driven to an activation voltage which could be, for example, 8V so as to select the first memory cell M0 for the write operation while the word line (e.g. WL1) of the memory cells (e.g. M7 M8) not being selected for the write operation remain at the ground voltage. With sufficient voltage difference between WL0 which is high and the first bit line BL0 which is low, the first memory cell M0 could be accessed and written into.

It is worth noting that as the drain node A of the first memory cell M0 is at the ground voltage while the first word line WL0 is at an activation voltage such as 8V, a current path could be generated between the first word line WL0 and the drain node A in response to a broken-down oxide layer between the first word line WL0 and the drain node A. Normally, the word line and the drain of the memory cell transistor are not electrically connected. However, the breaking down of the oxide layer is an irreversible process and enables the current path between the word line WL0 and the drain node A of the memory cell transistor.

Next, during the fourth time period T4, even though the write operation is assumed to have been completed, the first word line WL0 is not immediately pulled to the ground voltage but is instead pulled to a temporary voltage which is substantially lower than the activation voltage which activates the first WL0 but keeps the transistor cell of the first memory cell M0 active. The temporary voltage could be, for example, 2.5V. By doing so, the excessive charge on the float node of M0 can be discharged in the time period T5.

Next, during the fifth time period T5, the second bit line BL1 would no longer be pre-charged to Vdd and would be brought to the ground voltage while the drain node B of the transistor of the second memory cell M1 would also be brought to the ground voltage. Furthermore, the voltage of the first word line WL0 goes to the ground voltage at the end of the fifth time period. Also, at the end of the fifth time period, all the bit lines are at the ground voltage so as to discharge all charges previously on the bit line. Lastly, during the sixth time period, the first word line section line WSL0 is deactivated and goes to the ground voltage as the first memory cell M0 and the second memory cell M1 are no longer selected. At the end of the sixth time period, the write operation has been completed.

Figure 5:
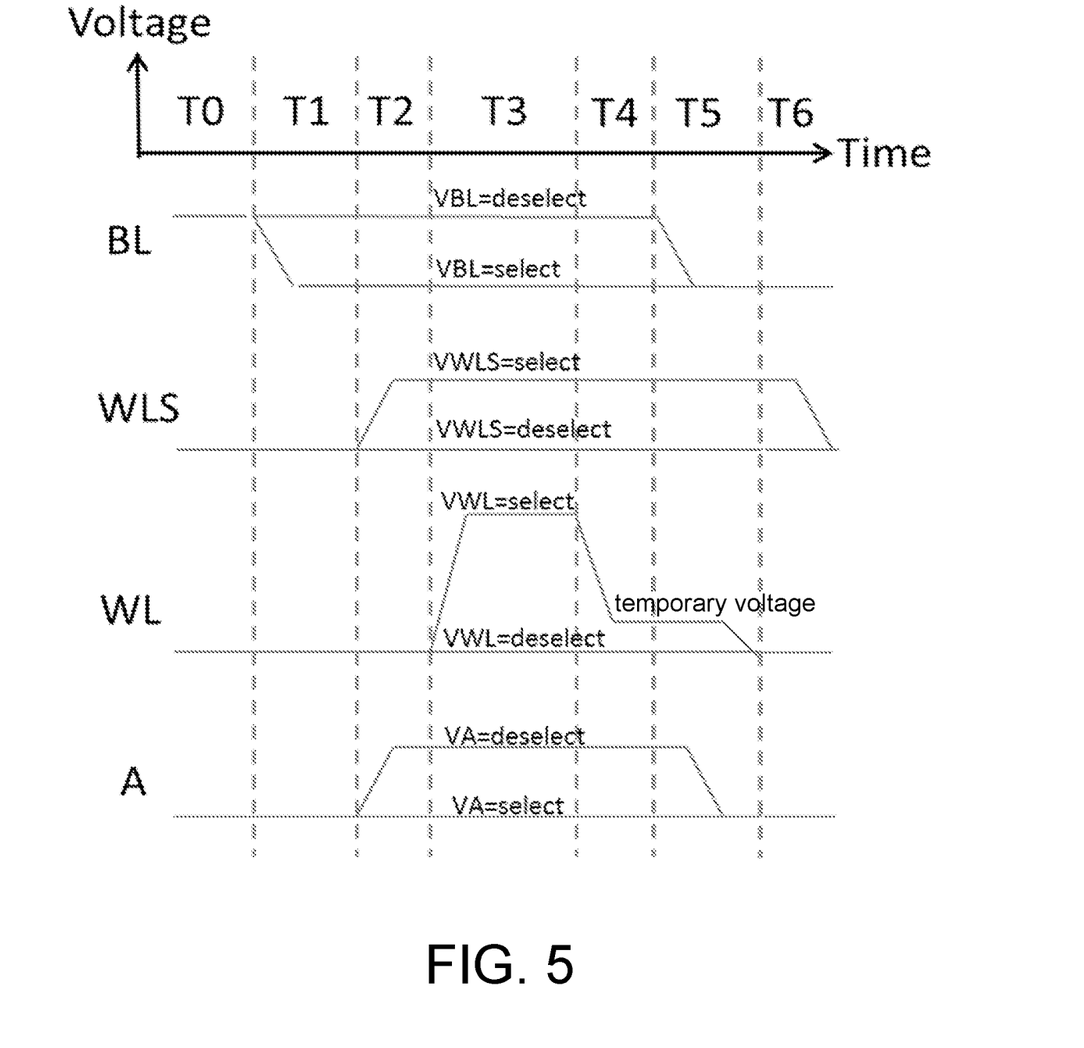
FIG. 5 illustrates another timing diagram which serves to elucidate the principle of operation of a second exemplary embodiment of the disclosure.

Alternatively, the memory circuit of FIG. 3 may operate according to a different timing diagram of FIG. 5 which serves to explain a slightly different principle of operation The description of FIG. 5 is to be made with reference to circuit diagram of FIG. 3. During the time T0 which is before the programming transistor M6 is activated, the first bit line BL0 and the second bit line BL1 have both been pre-charged to a power supply voltage which could be, for example, 5V. At the first time period T1, the programming transistor M6 is activated in order to write to the first memory cell M0, and subsequently the first bit line BL0 is pulled to the ground voltage by the programming transistor M6 while both the first pre-charge transistor M4 and the second pre-charge transistor M5 which drives the second bit line BL1 are still turned on. Moreover, during the first time period, the first word line section line WSL0, the first word line WL0, and the drain node A of the memory cell transistor are all set to the ground voltage.

Next, during a second time period T2, the first word line section line WSL0 to pulled high. Also, the drain node A of the first memory cell M0 is at the ground voltage while the drain node B of the second memory cell M1 is held at a voltage which could be, for example, 5V. Next, during a third time period T3, the first word line WL0 is driven to an activation voltage which could be, for example, 8V so as to select the first memory cell M0 for the write operation while the word line (e.g. WL1) of the memory cells (e.g. M7 M8) not being selected for the write operation remain at the ground voltage. Also, with sufficient voltage difference between WL0 which is high and the first bit line BL0 which is low, the first memory cell M0 could be accessed and written into.

Similar to the timing diagram of FIG. 4, as the drain node A of the first memory cell M0 is at the ground voltage while the first word line WL0 is at an activation voltage, a current path could be generated between the first word line WL0 and the drain node A in response to a broken-down oxide layer between the first word line WL0 and the drain node A. The breaking down of the oxide layer is an irreversible process and enables the current path between the word line WL0 and the drain node A of the memory cell transistor.

Next, during the fourth time period T4, even though the write operation is assumed to have been completed, the first word line WL0 is not immediately pulled to the ground voltage but is instead pulled to a temporary voltage which is substantially lower than the activation voltage which activates the first WL0 but keeps the transistor cell of the first memory cell M0 active. The temporary voltage could be, for example, 2.5V. By doing so, the excessive charge on the float node of M0 can be discharged in the time period T5.

Next, during the fifth time period T5, the second bit line BL1 would no longer be pre-charged to Vdd and would be brought to the ground voltage while the drain node B of the transistor of the second memory cell M1 would also be brought to the ground voltage. Furthermore, the voltage of the first word line WL0 goes to the ground voltage at the end of the fifth time period. Also, at the end of the fifth time period, all the bit lines are at the ground voltage so as to discharge all charges previously on the bit line. Lastly, during the sixth time period, the first word line section line WSL0 is deactivated and goes to the ground voltage as the first memory cell M0 and the second memory cell M1 are no longer selected. At the end of the sixth time period, the write operation has been completed.

Figure 6:
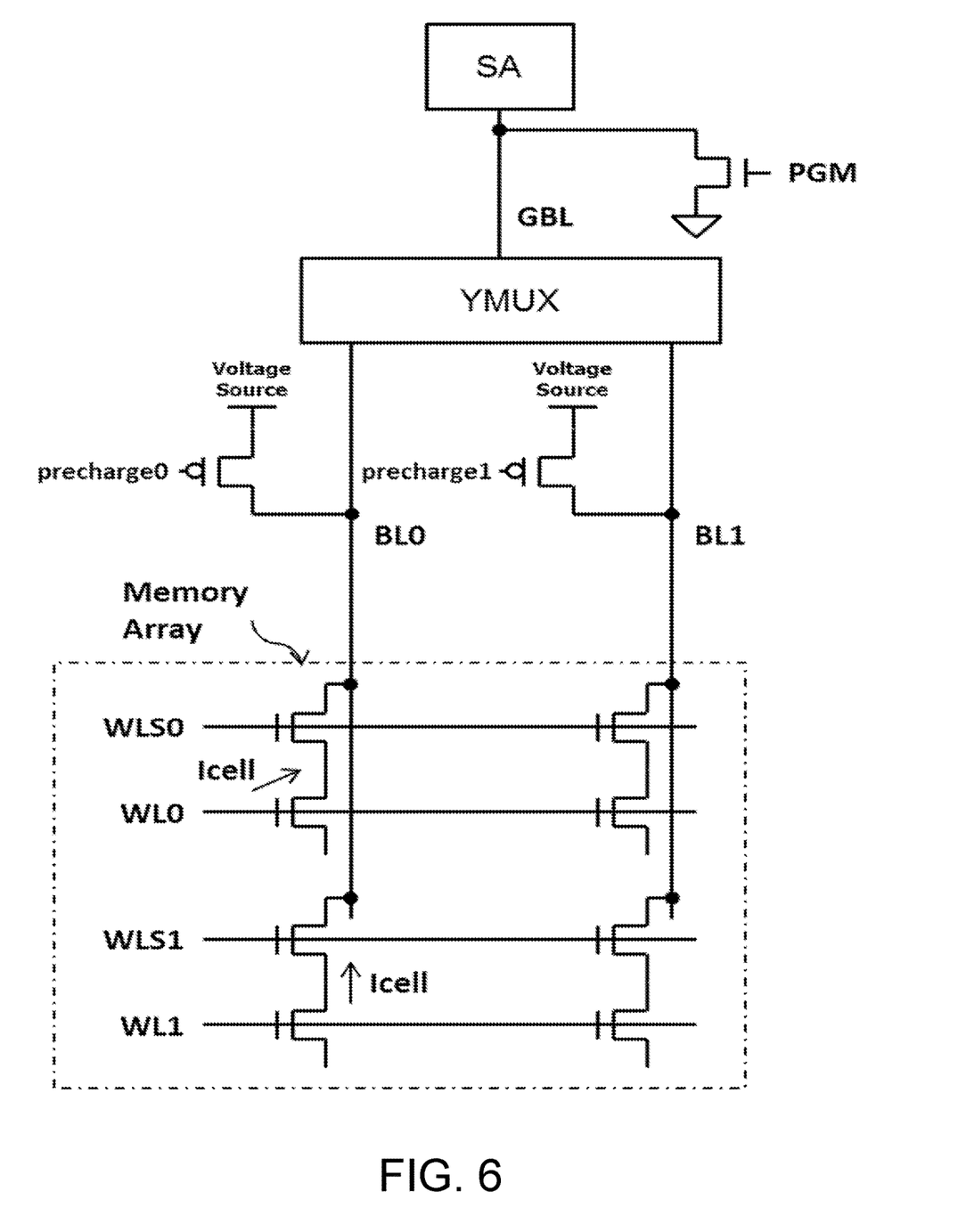
FIG. 6 illustrates is another detailed hardware diagram according to an exemplary embodiment of the disclosure.

FIG. 6 illustrates shows an alternative exemplary embodiment that is similar to the memory circuit of FIG. 3. For this exemplary embodiment, the difference is that within the pre-charge circuit (e.g. 104), each of the pre-charge device (e.g. M4 M5) could be separately controlled by a memory controller. In other words, each pre-charge device has its own selecting signal (e.g. precharge0, precharge1, and etc). Moreover, each of the pre-charge device may have the same driving capacity or different driving capacity from other pre-charge devices. For instance, the pre-charge transistor M4 could be smaller, equal, or larger than the pre-charge transistor M5.

In view of the aforementioned descriptions, the embodiments of the present disclosure are suitable for being used in a memory device and is able to efficiently program a memory cell and to reduce leakage current which may originate from one memory cell into another memory cell.

No element, act, or instruction used in the detailed description of disclosed embodiments of the present application should be construed as absolutely critical or essential to the present disclosure unless explicitly described as such. Also, as used herein, each of the indefinite articles "a" and "an" could include more than one item. If only one item is intended, the terms "a single" or similar languages would be used. Furthermore, the terms "any of" followed by a listing of a plurality of items and/or a plurality of categories of items, as used herein, are intended to include "any of", "any combination of", "any multiple of", and/or "any combination of multiples of the items and/or the categories of items, individually or in conjunction with other items and/or other categories of items. Further, as used herein, the term "set" is intended to include any number of items, including zero. Further, as used herein, the term "number" is intended to include any number, including zero.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A memory circuit comprising:
a memory array which comprises a first memory cell connected to a first bit line and a second memory cell connected to a second bit line,
a pre-charge circuit which is connected to the memory array and comprises a first pre-charge device, and
a programming circuit which is connected to the pre-charge circuit and comprises a programming transistor which has a higher drive capability than the first pre-charge device so as to drive the first bit line to a ground voltage in response to the first write operation, wherein in response to a first write operation on the first memory cell, a current flow exists between the programming circuit and the first pre-charge device.

2. The memory circuit of claim 1, wherein the first pre-charge device comprises a first pre-charge transistor which has a weaker bias than the programming transistor or is a different transistor type from the programming transistor.

3. The memory circuit of claim 1, wherein the first pre-charge device comprises a first pre-charge transistor, and a first gate width over length (W/L) ratio of the programming transistor is larger than a second gate W/L ratio of the first pre-charge transistor.

4. The memory circuit of claim 2, wherein in response to the first write operation, while the first bit line is at the ground voltage, the second bit line maintains a high voltage so as to block a current flow from the second memory cell to the second bit line.

5. The memory circuit of claim 1, wherein the first memory cell comprises a first transistor, and in response to the first write operation, a current path is generated between a word line of the first transistor and a drain of the first transistor.

6. The memory circuit of claim 5, wherein in response to a read operation which is after the first write operation, a current flows along the current path from the word line of the first transistor to the drain of the first transistor.

7. The memory circuit of claim 6, wherein the current path being generated is irreversible.

8. The memory circuit of claim 1, the pre-charge circuit comprises a plurality of pre-charge transistors which further comprises a second pre-charge transistor, each of the plurality of transistors is selectable according to a different selection signal for each of the plurality of transistors, and the second pre-charge transistor has a different drive capability from the first pre-charge transistor.

9. The memory circuit of claim 1, wherein in response to the first write operation, the first pre-charge transistor is left on for a second write operation on the first memory cell.

10. The memory circuit of claim 1, wherein in response to a third write operation on the second memory cell, the first bit line has the high voltage so as to block a current flow from the first memory cell to the first bit line.

11. The memory circuit of claim 1 further comprises a selecting circuit selecting among a plurality of bit lines comprising the first bit line and the second bit line, wherein in response to the first write operation on the first memory cell, the current between the programming circuit and the first pre-charge device flows through the selecting circuit.

12. The memory circuit of claim 11 further comprises
a sense amplifier circuit which is shared among a plurality of memory cells comprising the first memory cell and the second memory cell of the memory array and is connected to the selecting circuit through a global bit line which is coupled to one of a plurality of bit lines comprising the first bit line and the second bit line according to a selecting signal of the selecting circuit.

13. The memory circuit of claim 2, wherein pre-charge circuit further comprises a second pre-charge device, and during the first write operation on the first memory cell before the programming circuit is activated, the first bit line and the second bit line are at the ground voltage, and after the programming circuit is activated within a first time period, the first bit line remains at the ground voltage while the second pre-charge device drives the second bit line to a power supply voltage.

14. The memory circuit of claim 13, wherein during the first time period, a first word line section line, a first word line, and a first drain node which correspond to the first memory cell are set to the ground voltage, and during a second time period which is after the first time period, the first word line section line and the first drain node of the first memory cell remain at the ground voltage while a second drain node of the second memory cell is at a high voltage.

15. The memory circuit of claim 14, wherein after the first memory cell has been written, the first word line of the first memory cell is pulled down to a temporary voltage for a duration before being pulled down to the ground voltage.

16. The memory circuit of claim 2, wherein pre-charge circuit further comprises a second pre-charge device, and during the first write operation on the first memory cell before the programming circuit is activated, the first pre-charge device drives the first bit line to a power supply voltage and the second pre-charge device drives the power supply voltage, and after the programming circuit is activated within a first time period, the programming circuit drives the first bit line to the ground voltage while the second bit line remains at the power supply voltage.

17. The memory circuit of claim 16, wherein during the first time period, a first word line section line, a first word line, and a first drain node which correspond to the first memory cell are set to the ground voltage, and during a second time period which is after the first time period, the first word line section line and the first drain node of the first memory cell remain at the ground voltage while a second drain node of the second memory cell is at a high voltage.

18. The memory circuit of claim 17, wherein during a third period which is after the second period, the first word line is driven to the high voltage while a second word line of the second memory cell remains at the ground voltage.

19. The memory circuit of claim 18, wherein after the first memory cell has been written, the first word line of the first memory cell is pulled down from the high voltage to a temporary voltage for a duration before being pulled down to the ground voltage.

20. A memory device comprising:
a memory circuit comprising:
 a memory array which comprises a first memory cell connected to a first bit line and a second memory cell connected to a second bit line,
 a pre-charge circuit which is connected to the memory array and comprises a first pre-charge device, and
 a programming circuit which is connected to the pre-charge circuit and comprises a programming transistor which has a higher drive capability than the first pre-charge device so as to drive the first bit line to a ground voltage in response to the first write operation, wherein in response to a write operation on the first memory cell, a current flow exists between the programming circuit and the first pre-charge device.

* * * * *